(12) United States Patent
Lin et al.

(10) Patent No.: US 9,124,276 B2
(45) Date of Patent: Sep. 1, 2015

(54) SENSE AMPLIFIER INCLUDING A LEVEL SHIFTER

(71) Applicant: QUALCOMM Incorporated, San Diego, CA (US)

(72) Inventors: Jentsung Lin, San Diego, CA (US); Paul D. Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/721,119

(22) Filed: Dec. 20, 2012

(65) Prior Publication Data

US 2014/0176221 A1   Jun. 26, 2014

(51) Int. Cl.

| | | |
|---|---|---|
| *G01R 19/00* | (2006.01) | |
| *G11C 7/00* | (2006.01) | |
| *H03F 3/45* | (2006.01) | |
| *H03L 5/00* | (2006.01) | |
| *G11C 5/14* | (2006.01) | |
| *G11C 7/06* | (2006.01) | |
| *G11C 7/10* | (2006.01) | |

(52) U.S. Cl.
CPC .. *H03L 5/00* (2013.01); *G11C 5/14* (2013.01); *G11C 7/062* (2013.01); *G11C 7/065* (2013.01); *G11C 7/106* (2013.01); *G11C 7/1057* (2013.01)

(58) Field of Classification Search
CPC ................ H03K 19/018521; H03K 3/356113; H03K 19/00315; H03K 17/102; H03K 3/012
USPC ......... 327/51, 52, 55, 333; 326/63, 68, 80, 81
See application file for complete search history.

(56) References Cited

U.S. PATENT DOCUMENTS

| | | |
|---|---|---|
| 4,764,693 A | 8/1988 | Iwata |
| 4,984,204 A | 1/1991 | Sato et al. |
| 5,559,737 A | 9/1996 | Tanaka et al. |
| 5,844,441 A * | 12/1998 | Phoenix ........................ 327/333 |
| 5,903,171 A | 5/1999 | Shieh |
| 6,084,459 A * | 7/2000 | Jeong ............................. 327/333 |
| 7,091,748 B2 * | 8/2006 | Wada ............................... 326/81 |

(Continued)

FOREIGN PATENT DOCUMENTS

GB    2320780 A    7/1998

OTHER PUBLICATIONS

International Search Report and Written Opinion—PCT/US2013/077033—ISA/EPO—Mar. 21, 2014.

(Continued)

*Primary Examiner* — Quan Tra
(74) *Attorney, Agent, or Firm* — Peter Michael Kamarchik; Nicholas J. Pauley; Paul Holdaway

(57) ABSTRACT

An apparatus includes a sense amplifier that has a sense amplifier differential output. The sense amplifier may be in a first power domain. The apparatus may include level shifting circuitry that has a level shifter differential output. The level shifting circuitry may be coupled to the sense amplifier differential output. The level shifting circuitry may include a first transistor and a second transistor. A first sense amplifier output of the sense amplifier differential output may be coupled to the first transistor, and a second sense amplifier output of the sense amplifier differential output may be coupled to the second transistor. The apparatus may further include a latch to store data. The latch may be coupled to the level shifter differential output. The latch is in a second power domain that is different from the first power domain.

20 Claims, 6 Drawing Sheets

(56) References Cited

U.S. PATENT DOCUMENTS

| | | |
|---|---|---|
| 7,489,165 B2 | 2/2009 | Gans |
| 2004/0090246 A1 | 5/2004 | Gans |
| 2007/0188194 A1* | 8/2007 | Yang et al. .................. 326/80 |
| 2009/0033401 A1* | 2/2009 | Kossel et al. ............... 327/333 |
| 2011/0133562 A1* | 6/2011 | Koashi ........................ 307/80 |
| 2012/0119812 A1* | 5/2012 | Lencioni et al. ............ 327/333 |

OTHER PUBLICATIONS

Taiwan Search Report—TW102147647—TIPO—Jun. 8, 2015.

* cited by examiner

SENSE AMPLIFIER INCLUDING A LEVEL SHIFTER

I. FIELD

The present disclosure is generally related to voltage level shifting.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A computing device may have several power domains. Each power domain may be associated with a corresponding supply voltage level that is different from supply voltage levels associated with other power domains. For example, a signal generated in a first power domain associated with a first supply voltage level may be provided to circuitry in a second power domain associated with a second supply voltage level. If the first supply voltage level is lower than the second supply voltage level, providing the signal generated in the first power domain to the circuitry in the second power domain may cause short circuit current.

III. SUMMARY

A level shifter may be used to shift a voltage level of a signal generated by a sense amplifier in a first power domain and to provide the level shifted signal to circuitry in a second power domain. For example, the first power domain may be associated with a first supply voltage level. The sense amplifier may receive one or more input signals generated in the first power domain. For example, the input signals may be generated by a memory array that is in the first power domain. A differential output signal generated by the sense amplifier may be provided to the level shifter. For example, a first output signal of the differential output signal of the sense amplifier may be provided to a gate terminal of one or more transistors in the level shifter, and a second output signal of the differential output signal of the sense amplifier may be provided to a gate terminal of one or more other transistors in the level shifter. The level shifter may generate a level shifter differential output signal based on the differential output signal of the sense amplifier. The level shifter differential output signal may be provided to a latch that is in a second power domain.

The latch may store data corresponding to the level shifter differential output signal. The latch may generate a latch differential output signal based on the data stored in the latch. A level shifted differential output signal is generated based on the level shifter differential output signal and the latch differential output signal. When one or more transistors in the level shifter that generate the level shifter differential output signal are turned off, the level shifted differential output signal may be primarily based on the latch differential output signal. In an alternative embodiment, the level shifted differential output signal may be provided to a driver that is in the second power domain. The level shifted differential output signal may be generated based on the level shifter differential output signal and driver output signals.

In a particular embodiment, an apparatus includes a sense amplifier that has a sense amplifier differential output. The sense amplifier may be in a first power domain. The apparatus may also include level shifting circuitry that has a level shifter differential output. The level shifting circuitry may be coupled to the sense amplifier differential output. The level shifting circuitry may include a first pair of transistors including a first transistor and a second transistor. A first sense amplifier output of the sense amplifier differential output may be coupled to the first transistor, and a second sense amplifier output of the sense amplifier differential output may be coupled to the second transistor. The apparatus may further include a latch to store data. The latch may be coupled to the level shifter differential output. The latch is in a second power domain that is different from the first power domain.

In another particular embodiment, a method includes generating, by a sense amplifier, a sense amplifier differential output signal. The sense amplifier may be in a first power domain. The method may include generating, by a level shifter, a level shifter differential output signal responsive to the sense amplifier differential output signal. The level shifter may include a first pair of transistors including a first transistor and a second transistor. A first sense amplifier output signal of the sense amplifier differential output signal may be provided to the first transistor, and a second sense amplifier output signal of the sense amplifier differential output signal may be provided to the second transistor. The method may further include storing data in a latch responsive to the level shifter differential output signal. The latch may be in a second power domain that is different from the first power domain.

In another particular embodiment, an apparatus includes means for generating a differential output signal having a differential output. The means for generating the differential output signal may be in a first power domain. The apparatus may also include means for generating a level shifter differential output signal that has a level shifter differential output. The means for generating the level shifter differential output signal may include a first pair of transistors including a first transistor and a second transistor. A first output of the differential output may be coupled to the first transistor, and a second output of the differential output is coupled to the second transistor. The apparatus may further include means for storing data. The means for storing data may be coupled to the level shifter differential output. The means for storing data may be in a second power domain that is different from the first power domain.

In another particular embodiment, a non-transitory computer-readable medium includes program code that, when executed by a processor, causes the processor to retrieve data from a memory. The memory includes a sense amplifier to generate a sense amplifier differential output signal. The sense amplifier is in a first power domain. The memory also includes a level shifter to generate a level shifter differential output signal responsive to the sense amplifier differential output signal. The level shifter includes a first pair of transistors including a first transistor and a second transistor. A first sense amplifier output signal of the sense amplifier differential output signal is provided to the first transistor, and a second sense amplifier output signal of the differential output signal is provided to the second transistor. The memory also includes a latch to store data responsive to the level shifter differential output signal. The latch is in a second power domain that is different from the first power domain.

In another particular embodiment, an apparatus includes a sense amplifier having a sense amplifier differential output. The sense amplifier may be in a first power domain. The apparatus may also include level shifting circuitry that has a level shifter differential output. The level shifting circuitry may be coupled to the sense amplifier differential output. The level shifting circuitry may include a first pair of transistors including a first transistor and a second transistor. A first sense amplifier output of the sense amplifier differential output may be coupled to the first transistor, and a second sense amplifier output of the sense amplifier differential output may be coupled to the second transistor. The apparatus may further include a driver coupled to the level shifter differential output. The driver may be in a second power domain that is different from the first power domain.

One particular advantage provided by at least one of the disclosed embodiments is level shifting of a voltage level of a signal generated in one power domain for use in another power domain. By level shifting the voltage level of the signal, a short-circuit current that may result from using the signal in another power domain without level-shifting is substantially eliminated. Substantially eliminating the short-circuit current may reduce power consumption by a device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
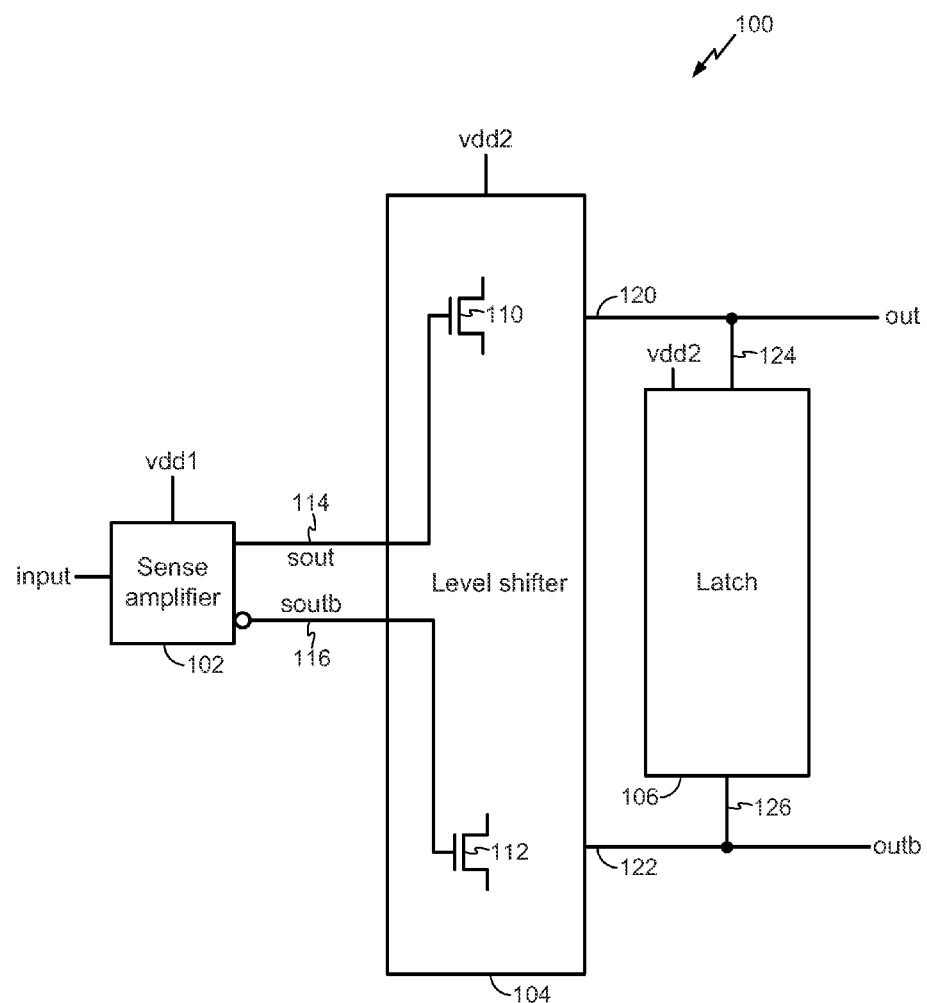
FIG. 1 is a block diagram of a particular embodiment of an apparatus including a sense amplifier with a level shifter.

Referring to FIG. 1, a particular illustrative embodiment of an apparatus that is operable to shift a voltage level of a signal is depicted and generally designated 100. The apparatus 100 may be configured to receive an input signal (input) generated in a first power domain and configured to generate a level shifted differential output signal (out, outb). The apparatus 100 includes a sense amplifier 102, level shifting circuitry (a level shifter) 104, and a latch 106. The sense amplifier 102 may be coupled to the level shifter 104. For example, a sense amplifier differential output 114, 116 of the sense amplifier 102 may be coupled to the level shifter 104. The level shifter 104 may be coupled to the latch 106. For example, a level shifter differential output 120, 122 of the level shifter 104 may be coupled to latch ports 124, 126 of the latch 106.

In a particular embodiment, the sense amplifier 102 may be configured to receive the input signal (input) and to generate a sense amplifier differential output signal (sout, soutb) responsive the input signal (input). The input signal (input) may be a single-ended signal or a differential signal. The sense amplifier 102 may generate the sense amplifier differential output signal (sout, soutb) on the sense amplifier differential output 114, 116. To illustrate, the sense amplifier 102 may generate a first sense amplifier output signal (sout) of the sense amplifier differential output signal (sout, soutb) on a first sense amplifier output 114 of the sense amplifier differential output 114, 116. The sense amplifier 102 may generate a second sense amplifier output signal (soutb) of the sense amplifier differential output signal (sout, soutb) on a second sense amplifier output 116 of the sense amplifier differential output 114, 116.

In a particular embodiment, the sense amplifier 102 may be in a first power domain that is associated with a first supply voltage (vdd1). For example, the sense amplifier 102 may be coupled to a voltage supply that provides the first supply voltage (vdd1). To illustrate, the voltage level of the first sense amplifier output signal (sout) and the second sense amplifier output signal (soutb) may be based on the first supply voltage (vdd1).

In a particular embodiment, the sense amplifier differential output signal (sout, soutb) generated by the sense amplifier 102 may be a one hot or no hot signal. For example, during a time interval, only one of the first sense amplifier output signal (sout) and the second sense amplifier output signal (soutb) may have a voltage level that approximately equals a first voltage level (vdd1 level) of the first supply voltage (vdd1) (e.g. a logical high value corresponding to the first supply voltage in a first power domain). During another time interval, both of the first sense amplifier output signal (sout) and the second sense amplifier output signal (soutb) may substantially simultaneously be at a low voltage level (e.g., a logic low value at approximately a ground voltage level).

In a particular embodiment, the level shifter 104 may be configured to receive the sense amplifier differential output signal (sout, soutb) from the sense amplifier 102. For example, the level shifter 104 may be coupled to the sense amplifier differential output 114, 116 of the sense amplifier 102. To illustrate, the level shifter 104 may include a pair of transistors including a first transistor 110 and a second transistor 112. The first sense amplifier output 114 of the sense amplifier differential output 114, 116 may be coupled to the first transistor 110, and the second sense amplifier output 116 of the sense amplifier differential output 114, 116 may be coupled to the second transistor 112.

Figure 2:
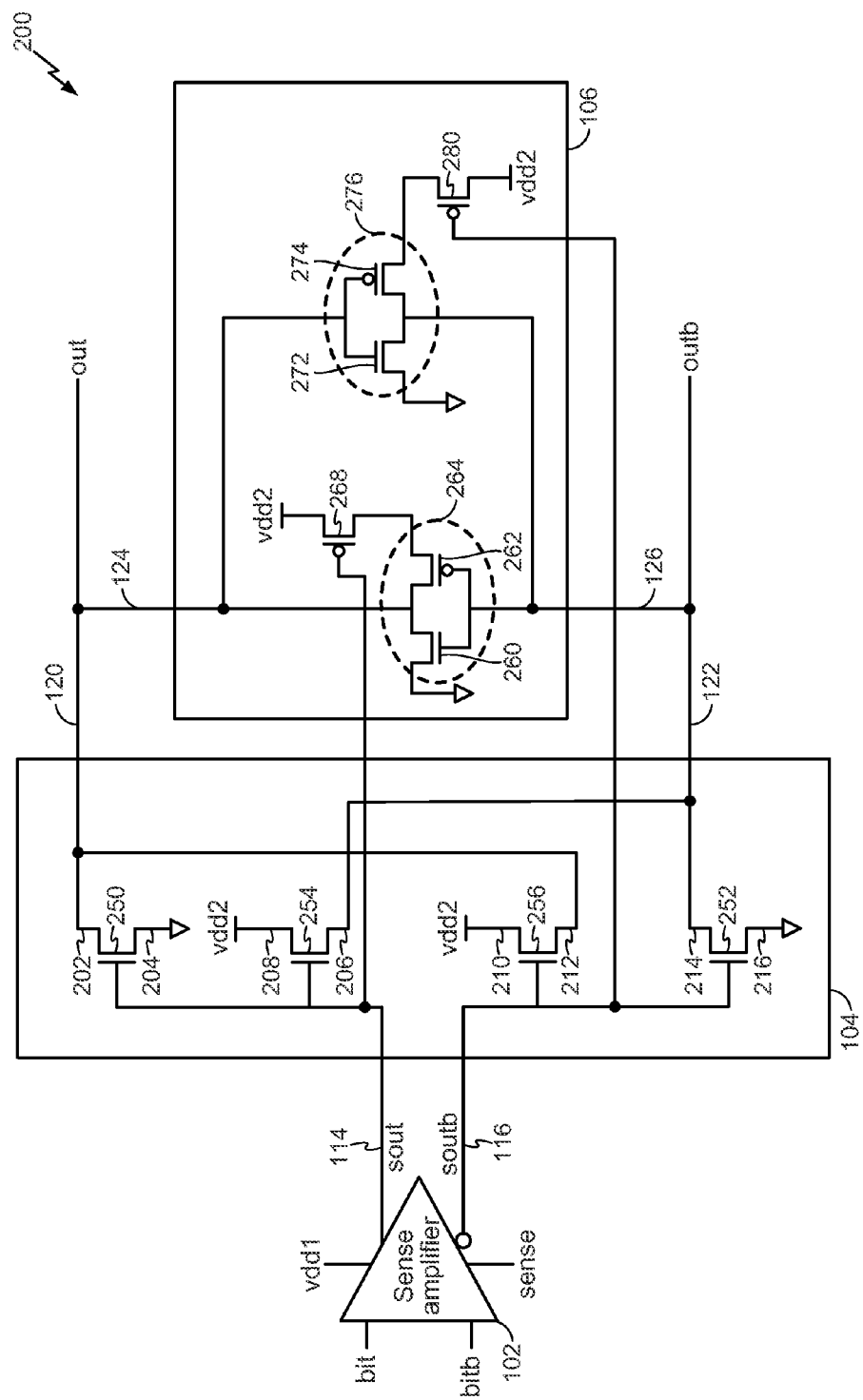
FIG. 2 is a diagram of a particular illustrative embodiment of the apparatus of FIG. 1.

In a particular embodiment, the level shifter 104 may be configured to generate a level shifter differential output signal responsive to the sense amplifier differential output signal (sout, soutb). The level shifter 104 may generate the differential output signal after a single transistor delay associated with the first transistor 110 and the second transistor 112 after the first sense amplifier output signal (sout) is provided to the first transistor 110 and the second sense amplifier output signal (soutb) is provided to the second transistor 112, in contrast to conventional level shifters that may introduce a multiple transistor or gate delay (e.g., a 3-5 gate delay) that impairs system performance. An example of an implementation of the level shifter 104 that introduces a single transistor delay is illustrated in FIG. 2.

In addition, by level-shifting the sense amplifier differential output signal (sout, soutb) from a voltage domain corresponding to the first supply voltage (vdd1) to a voltage domain associated with the latch 106, a short-circuit current through at least one p-type metal oxide semiconductor (PMOS) transistor of the latch 106 may be reduced or eliminated. The short-circuit current may otherwise result from a supply voltage difference that prevents the at least one PMOS transistor of the latch 106 from turning completely off.

The level shifter 104 may provide the level shifter differential output signal on a level shifter differential output 120, 122 of the level shifter 104. For example, the level shifter 104 may provide a first level shifter output signal of the level shifter differential output signal on a first level shifter output 120 of the level shifter differential output 120, 122. The level shifter 104 may provide a second level shifter output signal of the level shifter differential output signal on a second level shifter output 122 of the level shifter differential output 120, 122.

For example, a voltage level of the first level shifter output signal of the level shifter differential output signal may approximately equal a second voltage level (vdd2 level) of a second supply voltage (vdd2), and a voltage level of the second level shifter output of the level shifter differential output signal may approximately equal the ground voltage level. Alternatively, the voltage level of the first level shifter output of the level shifter differential output signal may approximately equal the ground voltage level, and the voltage level of the second level shifter output of the level shifter differential output signal may approximately equal the second voltage level (vdd2 level). The level shifter differential output signal may be provided to the latch 106. In a particular embodiment, the second voltage level (vdd2 level) is higher than the first voltage level (vdd1 level). For example, the first voltage level (vdd1 level) may be approximately 0.75 volts, and the second voltage level (vdd2 level) may be approximately 1.155 volts.

In a particular embodiment, the latch 106 may be configured to store data. To illustrate, the latch 106 may be coupled to the level shifter differential output 120, 122 of the level shifter 104. For example, the latch ports 124, 126 of the latch 106 may be coupled to the level shifter differential output 120, 122 of the level shifter 104. The latch 106 may store data corresponding to the level shifter differential output signal provided by the level shifter 104 on the level shifter differential output 120, 122.

In a particular embodiment, the latch 106 may be in a second power domain associated with the second supply voltage (vdd2). For example, the latch 106 may be coupled to a voltage supply that provides the second supply voltage (vdd2). To illustrate, the latch 106 may generate a latch differential output signal on the latch ports 124, 126 based on the data stored in the latch. For example, the latch 106 may generate a first latch output signal of the latch differential output signal on a first latch port 124 of the latch ports 124, 126. The latch 106 may generate a second latch output signal of the latch differential output signal on a second latch port 126 of the latch ports 124, 126.

To illustrate, a voltage level of the latch differential output signal may be approximately the second voltage level (vdd2 level). For example, the first latch output signal on the first latch port 124 may be at approximately the second voltage level (vdd2 level), and the second latch output signal on the second latch port 126 may be at approximately the ground voltage level. Alternatively, the first latch output signal on the first latch port 124 may be at approximately the ground voltage level, and the second latch output signal on the second latch port 126 may be at approximately the second voltage level (vdd2 level).

The latch differential output signal on the latch ports 124, 126 and the level shifter differential output signal on the level shifted differential output 120, 122 may produce the level shifted differential output signal (out, outb). To illustrate, the first latch output signal on the first latch port 124 and the first level shifter output signal on the first level shifter output 120 may provide a first level shifted output signal (out) of the level shifted differential output signal (out, outb). Similarly, the second latch output signal on the second latch port 126 and the second level shifter output signal on the second level shifter output 122 may provide a second level shifted output signal (outb) of the level shifted differential output signal (out, outb).

During operation, the input signal (input) may be provided to the sense amplifier 102. The sense amplifier 102 may generate the sense amplifier differential output signal (sout, soutb) based on the input signal (input). For example, during a particular time interval, if a voltage level of the input signal (input) approximately equals the first voltage level (vdd1 level), a voltage level of the first sense amplifier output signal (sout) may approximately equal the first voltage level (vdd1 level), and a voltage level of the second sense amplifier output signal (soutb) may approximately equal the ground voltage level. During another time interval, if the voltage level of the input signal (input) approximately equals the ground voltage level, the voltage level of the first sense amplifier output signal (sout) may approximately equal the ground voltage level, and the voltage level of the second sense amplifier output signal (soutb) may approximately equal the first voltage level (vdd1 level).

The level shifter 104 may generate the level shifter differential output signal on the level shifter differential output 120, 122 in response to the sense amplifier differential output signal (sout, soutb). For example, the voltage level of the first sense amplifier output signal (sout) may approximately equal the ground voltage level, and the voltage level of the second sense amplifier output signal (soutb) may approximately equal the first voltage level (vdd1 level). In response to the voltage level of the first sense amplifier output signal (sout) and the voltage level of the second sense amplifier output signal (soutb), the voltage level of the first level shifter output signal of the level shifter differential output signal may approximately equal the second voltage level (vdd2 level), and the voltage level of the second level shifter output signal of the level shifter differential output signal may approximately equal the ground voltage level.

The latch 106 may store data corresponding to the voltage level of the first level shifter output signal of the level shifter differential output signal and the voltage level of the second level shifter output signal of the level shifter differential output signal. The latch 106 may generate the latch differential output signal on the latch ports 124, 126 based on the data stored in the latch. For example, the latch 106 may generate, on the first latch port 124, the first latch output signal of the latch differential output signal that is at approximately the second voltage level (vdd2 level) and may generate, on the second latch port 126, the second latch output signal of the latch differential output signal that is at approximately the ground voltage level.

The first level shifted output signal (out) of the level shifted differential output signal (out, outb) may be at approximately the second voltage level (vdd2 level) based on the voltage level of the first level shifter output signal on the first level shifter output 120 and the voltage level of the first latch output signal on the first latch port 124. Similarly, the second level shifted output signal (outb) of the level shifted differential output signal (out, outb) may be at approximately the ground voltage level based on the voltage level of the second level shifter output signal on the second level shifter output 122 and the voltage level of the second latch output signal on the second latch port 126. When the first transistor 110 and the second transistor 112 are turned off, the level shifted differential output signal (out, outb) may be primarily based on the latch differential output signal on the latch ports 124, 126.

By generating the voltage level shifted differential output signal (out, outb) having the second voltage level (vdd2 level), power consumption of a device may be reduced. For example, providing the input signal (input), which may be at approximately the first voltage level (vdd1 level), without voltage level shifting to a gate terminal of a transistor that has a drain terminal at the second voltage level (vdd2 level) and a source terminal at the ground voltage level may result in a short-circuit current flowing through the transistor. Substantially eliminating the short-circuit current by performing voltage level shifting of the input signal (input) may reduce power consumption. Additionally, by using the latch 106, the level shifted differential output signal (out, outb) may be provided primarily by the latch 106 when the first transistor 110 and the second transistor 112 in the level shifter 104 are turned off. Additionally, by using a small number of elements (e.g., the first transistor 110) in the signal path between the sense amplifier 102 and the level shifted differential output signal (out, outb), a timing penalty on the signal path due to the level shifting operation is limited.

Although in FIG. 1 the first transistor 110 and the second transistor 112 are shown as n-channel metal oxide semiconductor (MOS) transistors, in a particular embodiment, the first transistor 110 and the second transistor 112 may be p-channel metal oxide semiconductor (MOS) transistors. Additionally, signals described above as having a particular voltage level may have another voltage level at a different time. For example, the first sense amplifier output signal (sout) may be at the first voltage level (vdd1 level) or at the ground level. The second sense amplifier output signal (soutb) may be at the first voltage level (vdd1 level) or at the ground level. The first level shifter output signal on the first level shifter output 120 may be at the second voltage level (vdd2 level) or at the ground level. The second level shifter output signal on the second level shifter output 122 may be at the second voltage level (vdd2 level) or at the ground level. The first level shifted output signal (out) may be at the second voltage level (vdd2 level) or at the ground level. The second level shifted output signal (outb) may be at the second voltage level (vdd2 level) or at the ground level.

Referring to FIG. 2, a particular illustrative embodiment of the apparatus 100 of FIG. 1 is depicted and generally designated 200. The apparatus 200 includes the sense amplifier 102, the level shifting circuitry (the level shifter) 104, and the latch 106. The sense amplifier 102 may be coupled to the level shifter 104, and the level shifter 104 may be coupled to the latch 106.

In a particular embodiment, the sense amplifier 102 may be configured to receive a differential input signal (bit, bitb) and to generate the sense amplifier differential output signal (sout, soutb). For example, the differential input signal (bit, bitb) may correspond to the input signal (input) of FIG. 1. For example, during a time interval, a first input signal (bit) of the differential input signal (bit, bitb) may be at approximately the first voltage level (vdd1 level) and a second input signal (bitb) of the differential input signal (bit, bitb) may be approximately at the ground voltage level. The sense amplifier 102 may further be configured to receive a control input signal (sense). The sense amplifier 102 may be coupled to a first voltage supply that provides the first supply voltage (vdd1) to the sense amplifier 102.

In a particular embodiment, the sense amplifier 102 may be in a first power domain that is associated with the first supply voltage (vdd1). To illustrate, the sense amplifier 102 may be coupled to the first voltage supply that provides the first supply voltage (vdd1) at the first voltage level (vdd1 level). For example, during a time interval, the voltage level of the first sense amplifier output signal (sout) may approximately equal the first voltage level (vdd1 level) based on the first voltage (vdd1), and the voltage level of the second sense amplifier output signal (soutb) may approximately equal the ground voltage level. As another example, during another time interval, the voltage level of the first sense amplifier output signal (sout) may be approximately the ground voltage level and the voltage level of the second sense amplifier output signal (soutb) may be approximately the first voltage level (vdd1 level) based on the first voltage (vdd1).

In a particular embodiment, the sense amplifier 102 may generate the sense amplifier differential output signal (sout, soutb) in response to the differential input signal (bit, bitb) if the control signal (sense) is asserted. For example, the sense amplifier 102 may generate the sense amplifier differential output signal (sout, soutb) based on the differential input signal (bit, bitb) when the control signal (sense) is approximately at the first voltage level (vdd1 level) of the first voltage (vdd1). When the control signal (sense) is not asserted, the sense amplifier 102 may generate the sense amplifier differential output signal (sout, south) such that the first sense amplifier output (sout) and the second sense amplifier output (soutb) are both at the ground voltage level.

In a particular embodiment, the level shifter 104 includes a first pair of transistors including a first transistor 250 and a second transistor 252. The level shifter 104 may also include a second pair of transistors including a third transistor 254 and a fourth transistor 256. In a particular embodiment, the first transistor 250, the second transistor 252, the third transistor 254, and the fourth transistor 256 may be n-channel MOS transistors. In a particular embodiment, the first transistor 250 and the second transistor 252 may correspond to the first transistor 110 and the second transistor 112, respectively, of FIG. 1. In another particular embodiment, the third transistor 254 and the fourth transistor 256 may correspond to the first transistor 110 and the second transistor 112, respectively, of FIG. 1.

In a particular embodiment, the first sense amplifier output 114 of the sense amplifier differential output 114, 116 may be coupled to a gate terminal of the first transistor 250 and to a gate terminal of the third transistor 254. A first terminal 204 of the first transistor 250 and a first terminal 216 of the second transistor 252 may be coupled to the ground supply. A second terminal 202 of the first transistor 250 may be coupled to a first level shifter output 120 of the level shifter differential output 120, 122, and a second terminal 214 of the second transistor 252 may be coupled to a second level shifter output 122 of the level shifter differential output 120, 122. The second terminal 202 of the first transistor 250 and the second terminal 214 of the second transistor 252 may further be coupled to the latch 106.

In a particular embodiment, the second sense amplifier output 116 of the sense amplifier differential output 114, 116 may be coupled to a gate terminal of the second transistor 252 and to a gate terminal of the fourth transistor 256. A first terminal 208 of the third transistor 254 and a first terminal 210 of the fourth transistor 256 may be coupled to the second supply voltage that provides the second supply voltage (vdd2). A second terminal 206 of the third transistor 254 may be coupled to the second level shifter output 122 of the level shifter differential output 120, 122, and a second terminal 212 of the fourth transistor 256 may be coupled to the first level shifter output 120 of the level shifter differential output 120, 122. The second terminal 206 of the third transistor 252 and the second terminal 212 of the fourth transistor 256 may be coupled to the latch 106.

In a particular embodiment, the latch 106 may include a first inverter 264 (e.g. a third pair of transistors 260, 262). For example, the first transistor 260 of the first inverter 264 may be an n-channel MOS transistor, and the second transistor 262 of the first inverter 264 may be a p-channel MOS transistor. In a particular embodiment, a gate terminal of the first transistor 260 may be coupled to a gate terminal of the second transistor 262. A first terminal of the first transistor 260 may be coupled to ground. A second terminal of the first transistor 260 may be coupled to a first terminal of the second transistor 262.

The latch 106 may further include a first pull-up transistor 268. The first pull-up transistor 268 may be coupled to a second terminal of the second transistor 262 of the first inverter 264. To illustrate, the first pull-up transistor 268 may be a p-channel MOS transistor. A first terminal of the first pull-up transistor 268 may be coupled to the second voltage supply that provides the second supply voltage (vdd2). A gate terminal of the first pull-up transistor 268 may be coupled to the first sense amplifier output 114 of the sense amplifier differential output 114, 116.

The latch 106 may further include a second inverter 276 (e.g., a fourth pair of transistors 272, 274). For example, the first transistor 272 of the second inverter 276 may be an n-channel MOS transistor, and the second transistor 274 of the second inverter 276 may be a p-channel MOS transistor. In a particular embodiment, a gate terminal of the first transistor 272 of the second inverter 276 may be coupled to a gate terminal of the second transistor 274 of the second inverter 276. A first terminal of the first transistor 272 may be coupled to ground. A second terminal of the first transistor 272 may be coupled to a first terminal of the second transistor 274.

The latch 106 may further include a second pull-up transistor 280. The second pull-up transistor 280 may be coupled to a second terminal of the second transistor 274 of the second inverter 276. The second pull-up transistor 280 may be a p-channel MOS transistor. A first terminal of the second pull-up transistor 280 may be coupled to the second voltage supply that provides the second supply voltage (vdd2). A gate terminal of the second pull-up transistor 280 may be coupled to the second sense amplifier output 116 of the sense amplifier differential output 114, 116.

An output of the first inverter 264 may be coupled to an input of the second inverter 276. An output of the second inverter 276 may be coupled to an input of the first inverter 264. The input of the first inverter 264 and the output of the second inverter 276 may also be coupled to the second latch port 126 of the latch ports 124, 126. The output of the first inverter 264 and the input of the second inverter 276 may be coupled to the first latch port 124 of the latch ports 124, 126.

In a particular embodiment, the first latch port 124 of the latch ports 124, 126 may be coupled to the first level shifter output 120 of the level shifter differential output 120, 122, and the second latch port 126 of the latch ports 124, 126 may be coupled to the second level shifter output 122 of the level shifter differential output 120, 122.

In a particular embodiment, the latch 106 may be in a second power domain that is different from the first power domain that is associated with the first supply voltage (vdd1). For example, the first inverter 264 may be coupled to the second voltage supply that provides the second supply voltage (vdd2) via the first pull-up transistor 268, and the second inverter 276 may be coupled to the second voltage supply that provides the second supply voltage (vdd2) via the second pull-up transistor 280.

During operation, the differential input signal (bit, bitb) may be provided to the sense amplifier 102. If the control signal (sense) is asserted (e.g., at approximately the first voltage level (vdd1 level)), the sense amplifier 102 may generate the sense amplifier differential output signal (sout, soutb) based on the differential input signal (bit, bitb). For example, if the control signal (sense) is asserted, the sense amplifier 102 may generate the sense amplifier differential output signal (sout, soutb) such that one of the first sense amplifier output signal (sout) and the second sense amplifier output signal (soutb) is approximately at the first voltage level (vdd1 level). To illustrate, if the control signal (sense) is asserted, the voltage level of the first sense amplifier output signal (sout) may equal approximately the first voltage level (vdd1 level), and the voltage level of the second sense amplifier output signal (soutb) may equal approximately the ground voltage level. Alternatively, if the control signal (sense) is asserted, the voltage level of the first sense amplifier output signal (sout) may equal approximately the ground voltage level, and the voltage level of the second sense amplifier output signal (soutb) may equal approximately the first voltage level (vdd1 level). If the control signal (sense) is not asserted (e.g., at approximately the ground voltage level), both the first sense amplifier output signal (sout) and the second sense amplifier output signal (soutb) may be approximately at the ground voltage level.

The level shifter 104 may generate the level shifter differential output signal on the level shifter differential output 120, 122 in response to the sense amplifier differential output signal (sout, soutb). For example, the first sense amplifier output signal (sout) may be at approximately the ground voltage level, and the second sense amplifier output signal (soutb) may be at approximately the first voltage level (vdd1 level). The first sense amplifier output (sout) being at the ground voltage level results in the first transistor 250 and the third transistor 254 being deactivated. In response to the second sense amplifier output signal (soutb) being at the first voltage level, when the first level shifter output 120 is initially discharged (e.g., at ground) and the second level shifter output 122 is initially charged (e.g., at Vdd2), the second transistor 252 discharges the second level shifter output 122 to ground while the fourth transistor 256 initiates charging of the first level shifter output 120 (e.g., to the lower of Vdd2 or Vdd1–Vth, where Vth is a threshold voltage of the fourth transistor 256). Charging of the first level shifter output 120 to Vdd2 when Vdd1 is less than Vdd2 may be completed via feedback from the latch 106, as explained in further detail below. When the first level shifter output 120 is initially charged (e.g., at Vdd2) and the second level shifter output 122 is initially discharged (e.g., at ground), the second transistor 252 holds the second level shifter output 122 at ground, and the first level shifter output 120 remains charged. The fourth transistor 256 may operate in a saturation mode, a linear mode, or a subthreshold mode based on values of Vdd1, Vdd2, and Vth.

As another example, the first sense amplifier output signal (sout) may be at approximately the first voltage level (vdd1 level), and the second sense amplifier output signal (soutb) may be at approximately the ground voltage level. The second sense amplifier output (soutb) being at the ground voltage level results in the second transistor 252 and the fourth transistor 256 being deactivated. In response to the first sense amplifier output signal (sout) being at the first voltage level (vdd1), when the first level shifter output 120 is initially charged (e.g., at Vdd2) and the second level shifter output 122 is initially discharged (e.g., at ground), the first transistor 250 discharges the first level shifter output 120 to ground while the third transistor 254 initiates charging of the second level shifter output 122 (e.g., to the lower of Vdd2 or Vdd1−Vth, where Vth is a threshold voltage of the second transistor 254). Charging of the second level shifter output 122 to Vdd2 when Vdd1 is less than Vdd2 may be completed via feedback from the latch 106, as explained in further detail below. When the first level shifter output 120 is initially discharged (e.g., at ground) and the second level shifter output 122 is initially charged (e.g., at Vdd2), the first transistor 250 holds the first level shifter output 120 at ground, and the second level shifter output 122 remains charged. The third transistor 254 may operate in a saturation mode, a linear mode, or a subthreshold mode based on values of Vdd1, Vdd2, and Vth.

The latch 106 may store data corresponding to the voltage level of the first level shifter output signal on the first level shifter output 120 and to the voltage level of the second level shifter output signal on the second level shifter output 122. To illustrate, because the sense amplifier differential output signal (sout, soutb) is a one hot or no hot signal, the first pull-up transistor 268 may be turned on while the second pull-up transistor 280 is turned off to enable the third pair of transistors (i.e. the inverter 264) to drive the first level shifter output 120 to a logical high value corresponding to the second power domain (vdd2) in response to the second level shifter output 122 having a logical low value. Alternatively, the first pull-up transistor 268 may be turned off while the second pull-up transistor 280 is turned on to enable the fourth pair of transistors (i.e. the inverter 276) to drive the second level shifter output 122 to a logical high value corresponding to the second power domain (vdd2) in response to the first level shifter output 120 having a logical low value. For example, when the first sense amplifier output signal (sout) is at approximately the ground voltage level, the first pull-up transistor 268 may be turned on enabling the first inverter 264 to receive the second level shifter output signal on the second level shifter output 122 via the second latch port 126 and to generate the first latch output signal on the first latch port 124. When the second sense amplifier output signal (soutb) is at approximately the ground voltage level, the second pull-up transistor 280 may be turned on enabling the second inverter 276 to receive the first level shifter output signal on the first level shifter output 120 via the first latch port 124 and to generate the second latch output signal on the second latch port 126.

When the first sense amplifier output signal (sout) is at approximately the first voltage level (vdd1 level) and the second sense amplifier output signal (soutb) is at approximately ground, the second pull-up transistor 280 may be activated and the first pull-up transistor 268 may be at least partially turned off, such as in a linear mode (when Vdd1 is less than Vdd2 and Vdd2−Vdd1 is greater than a threshold voltage of the first pull-up transistor 268) or in a subthreshold mode (when Vdd2 is not greater than Vdd1 or when Vdd2−Vdd1 is less than the threshold voltage of the first pull-up transistor 268). Similarly, when the second sense amplifier output signal (soutb) is at approximately the first voltage level (vdd1 level) and the first sense amplifier output signal (sout) is at approximately ground, the first pull-up transistor 268 may be activated and the second pull-up transistor 280 may be at least partially turned off. When the first pull-up transistor 268 is turned off, the first level shifted differential output signal (out) is primarily based on the first level shifter output signal on the first level shifter output 120. When the second pull-up transistor 280 is turned off, the second level shifted differential output signal (outb) is primarily based on the second level shifter output signal on the second level shifter output 122.

When both the first sense amplifier output signal (sout) and the second sense amplifier output signal (soutb) are at approximately the ground voltage level, the first inverter 264 may generate the first latch output signal on the first latch port 124 and the second inverter 276 may generate the second latch output signal on the first latch port 126. Because the first pull-up transistor 268 is coupled to the second voltage supply providing the second supply voltage (vdd2), the first latch output signal on the first latch port 124 may be at the second supply voltage (vdd2) while the second latch output signal on the second latch port 126 may be at the ground voltage level. Alternatively, because the second pull-up transistor 280 is coupled to the second voltage supply providing the second supply voltage (vdd2), the second latch output signal on the second latch port 126 may be at the second voltage level (vdd2 level) while the first latch output signal on the first latch port 124 may be at the ground voltage level.

The first level shifter output signal on the first level shifter output 120 of the level shifter 104 and the first latch output signal on the first latch port 124 of the latch 106 may provide the first level shifted output signal (out) of the level shifted differential output signal (out, outb). Similarly, the second level shifter output signal on the second level shifter output 122 of the level shifter 104 and the second latch output signal on the second latch port 126 of the latch 106 may provide the second level shifted output (outb) of the level shifted differential output signal (out, outb).

Because the first transistor 250, the second transistor 252, the third transistor 254, and the fourth transistor 256 are turned off when the first sense amplifier output signal (sout) and the second sense amplifier output signal (soutb) are at approximately the ground voltage level (for example, when the control signal (sense) is not asserted), the level shifted differential output signals (out, outb) may be primarily based on the first latch output signal on the first latch port 124 and the second latch output signal on the second latch port 126.

By generating the level shifted differential output signal (out, outb) at the second voltage level (vdd2 level) from the differential input signal (bit, bitb) at the first voltage level (vdd1 level), a short-circuit current that may result from use of the differential input signal (bit, bitb) without level-shifting is substantially eliminated. For example, providing the first input signal (bit) and the second input signal (bitb) without voltage level shifting to a gate terminal of a transistor (e.g., the first pull-up transistor 268 and/or the second pull-up transistor 280, respectively) that has a drain terminal at the second voltage level (vdd2 level) and a source terminal coupled (directly or indirectly) to ground may result in current flowing through the transistor when the second voltage level (vdd2) is greater than the first voltage level (vdd1). A supply voltage difference may prevent the transistor (e.g., the first pull-up transistor 268 and/or the second pull-up transistor 280) from turning completely off, allowing current to flow through the transistor. Substantially eliminating such current (i.e., the short-circuit current) reduces power consumption and may prevent circuit malfunction. Additionally, by using the latch 106, the level shifted differential output signal (out, outb) may be provided primarily by the latch 106 when the first transistor 250, the second transistor 252, the third transistor 254, and the fourth transistor 256 are turned off when the control signal (sense) is deasserted. Additionally, by using a small number of elements (e.g., the first transistor 250 and the second transistor 252) in the signal path between the sense amplifier 102 and the level shifted differential output signal (out, outb), a timing delay on the signal path due to the level shifting operation is reduced (e.g., to a single transistor delay).

In alternate embodiments, the latch 106 may have other configurations. For example, the latch 106 may include the cross-coupled inverters 264, 276 without including the first pull-up transistor 268 and the second pull-up transistor 280. Alternatively, the latch 106 may include a pair of bipolar junction transistors (BJTs) (e.g., a first BJT and a second BJT).

Although FIG. 2 shows the first transistor 250, the second transistor 252, the third transistor 254, and the fourth transistor 256 as n-channel MOS transistors, in another embodiment, the first transistor 250, the second transistor 252, the third transistor 254, and the fourth transistor 256 may be p-channel MOS transistors. Although FIG. 2 shows the first pull-up transistor 268 and the second pull-up transistor 280 as p-channel MOS transistors, in another embodiment, the first pull-up transistor 268 and the second pull-up transistor 280 may be n-channel MOS transistors. For example, exchanging transistor types (i.e., replacing n-channel MOS transistors with p-channel MOS transistors and replacing p-channel MOS transistors with n-channel MOS transistors) and exchanging signal polarity (e.g., exchanging sout and soutb) may result in substantially similar operation as described with respect to the apparatus 200.

Figure 3:
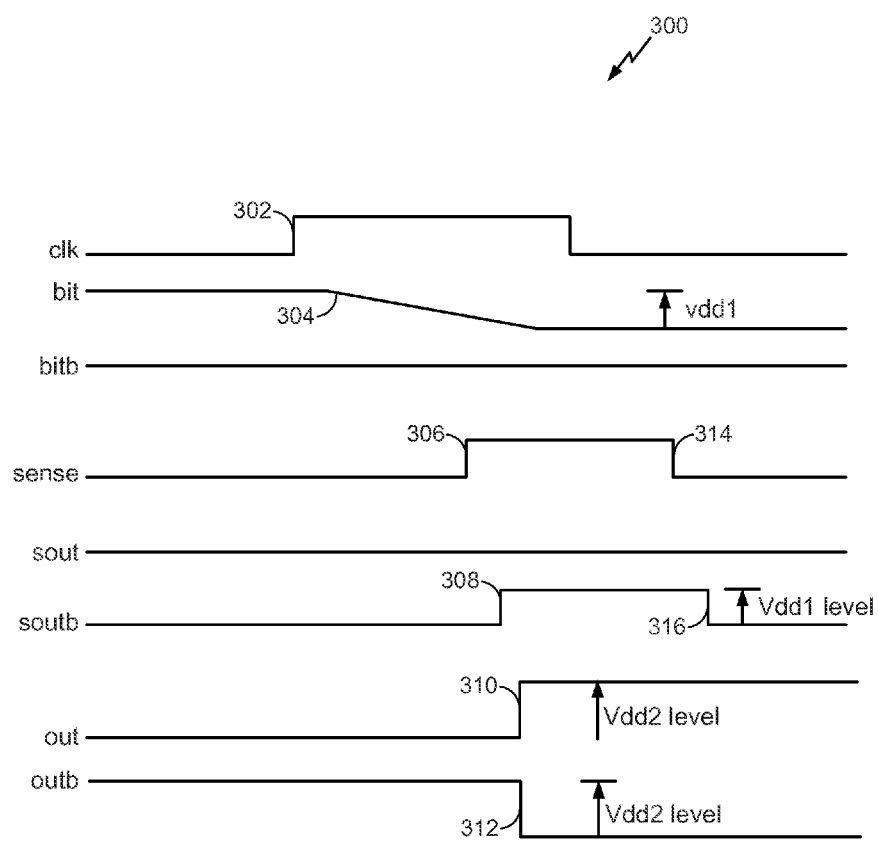
FIG. 3 is a timing diagram illustrating signal traces that correspond to the apparatus of FIG. 2.

Referring to FIG. 3, a timing diagram illustrating signal traces that correspond to operation of the apparatus 200 of FIG. 2 to generate a level shifted differential output signal is depicted and generally designated 300. The diagram 300 shows a clock signal (clk) that may be provided to a memory cell (not shown), the first input signal (bit), the second input signal (bitb), the control signal (sense), the first sense amplifier output signal (sout), the second sense amplifier output signal (soutb), the first level shifted output signal (out), and the second level shifted output signal (outb).

At transition 302, the clock signal (clk) may transition from a low voltage level to a high voltage level indicating a read operation on the memory cell. The memory cell may have a first bit line that provides the first input signal (bit) to the sense amplifier 102 of FIG. 2. The memory cell may also have a second bit line that provides the second input signal (bitb) to the sense amplifier 102 of FIGS. 1 and 2. For example, the read operation on the memory cell may result in a voltage discharge of the first bit line of the memory cell that provides the first input signal (bit). The voltage discharge of the first bit line of the memory cell may correspond to transition 304. The control signal (sense) may transition from a low voltage level (e.g., the ground voltage level) to a high voltage level (e.g., the first voltage level (vdd1 level)) at transition 306. In response to the control signal (sense) transitioning at the transition 306 and based on the first input signal (bit) and the second input signal (bitb), the second sense amplifier output (soutb) of the sense amplifier 102 may transition from a low voltage level (e.g., approximately the ground voltage level) to approximately the first voltage level (vdd1 level) at transition 308.

Because the sense amplifier differential output signal (sout, soutb) is either one hot or no hot, one of the first sense amplifier output signal (sout) and the second sense amplifier output signal (soutb) may be asserted by the sense amplifier during a particular time interval. The time interval may correspond to approximately a pulse width of the control signal (sense). For example, the first sense amplifier output (sout) may remain approximately at the ground voltage level after the control signal (sense) transitions at the transition 306.

Because the first sense amplifier output signal (sout) is provided to the gate terminal of the first transistor 250 and to the gate terminal of the third transistor 254 of FIG. 2, the first transistor 250 and the third transistor 254 may remain turned off. The second transistor 252 and the fourth transistor 256 may be turned on by the second sense amplifier output signal (soutb) that is at approximately the first voltage level (vdd1 level). Because the fourth transistor 256 is coupled to the second voltage supply providing the second supply voltage (vdd2), the first level shifted output signal on the first level shifter output 120 begins a transition toward the second voltage level (vdd2 level). The first level shifted output signal (out) completes the transition in response to feedback from the latch 106 (i.e. the second inverter 264 driving the first level shifter output 120), resulting in the first level shifted output signal (out) transitioning to the second voltage level (vdd2 level) at transition 310. Thus, the first level shifted output signal (out) of the level shifted differential output signal (out, outb) may be at the second voltage level (vdd2 level) that is different from the first voltage level (vdd1 level) of the differential input signal (bit, bitb) as well as the first voltage level (vdd1 level) of the second sense amplifier output signal (soutb). In a particular embodiment, the first voltage level (vdd1 level) may be approximately 0.75 volts, and the second voltage level (vdd2 level) may be approximately 1.155 volts.

In addition, because the second transistor 252 is coupled to the ground supply, the second level shifter output signal on the second level shifter output 122 transitions to the ground voltage level resulting in the second level shifted output signal (outb) transitioning to approximately the ground voltage level at transition 312.

The control signal (sense) transitions to the low voltage level (e.g., the ground voltage level) at transition 314. For example, the pulse width of the control signal (sense) corresponds to the time interval between the transition 306 and the transition 314. In response to the transition of the control signal (sense) at the transition 314, the second sense amplifier output (soutb) of the sense amplifier 102 may transition from the first voltage level (vdd1 level) to the ground voltage level at transition 316. The first sense amplifier output (sout) of the sense amplifier 102 may remain at the ground voltage level. In response to the transition of the second sense amplifier output (soutb) at the transition 316, the second transistor 252 and the fourth transistor 256 may be turned off. While the second transistor 252 and the fourth transistor 256 are turned off, the first level shifted output signal (out) is driven primarily by the latch 106 via the first latch port 124, and the second level shifted output signal (outb) is driven primarily by the latch 106 via the second latch port 126.

The latch 106 may drive the first level shifted output signal (out) and the second level shifted output signal (outb) based on the data stored in the latch 106. Because the latch 106 is in the second power domain associated with the second voltage supply (vdd2), the first level shifted output signal (out) driven by the latch 106 may be approximately at the second voltage level (vdd2 level). Thus, the first level shifted output signal (out) of the level shifted differential output signal (out, outb) may remain at the second voltage level (vdd2 level) after the second sense amplifier output (soutb) of the sense amplifier 102 transition to approximately the ground voltage level at the transition 316. In addition, based on the data stored in the latch 106, the second level shifted output signal (outb) may remain at approximately at the ground voltage level after the second sense amplifier output (soutb) of the sense amplifier 102 transitions to approximately the ground voltage level at the transition 316.

Figure 4:
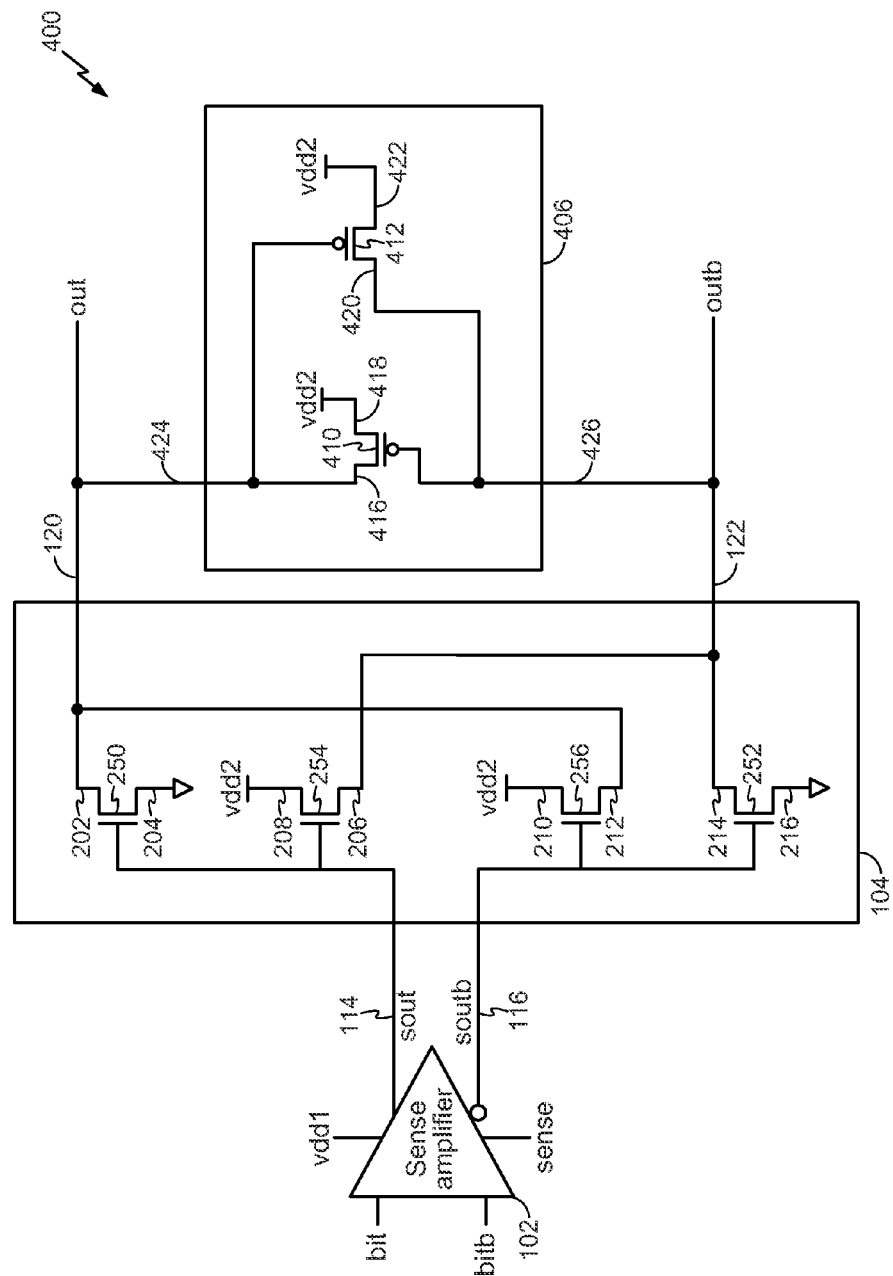
FIG. 4 is a diagram of another particular embodiment of an apparatus including a sense amplifier with a level shifter.

Referring to FIG. 4, a particular illustrative embodiment of an apparatus that is operable to shift a voltage level of a signal is depicted and generally designated 400. The apparatus 400 may be configured to receive the input signal (input) and to generate the level shifted differential output signal (out, outb). The apparatus 400 includes the sense amplifier 102, the level shifting circuitry (the level shifter) 104, and a driver 406. The sense amplifier 102 may correspond to the sense amplifier 102 of FIGS. 1 and 2, and the level shifter 104 may correspond to the level shifter 104 of FIGS. 1 and 2. The sense amplifier 102 may be coupled to the level shifter 104 in the manner described with respect to FIGS. 1 and 2.

In a particular embodiment, the driver 406 may be coupled to the level shifter differential output 120, 122. For example, driver ports 424, 426 of the driver 406 may be coupled to the level shifter differential output 120, 122. A first driver port 424 of the driver 406 may be coupled to the first level shifter output 120, and a second driver port 426 of the driver 406 may be coupled to the second level shifter output 122. The driver 406 may be configured to generate a first driver output signal on the first driver port 424 and to generate a second driver output signal on the second driver port 426.

In a particular embodiment, the driver 406 may include a first driver transistor 410 and a second driver transistor 412. For example, both the first driver transistor 410 and the second driver transistor 412 may be p-channel MOS transistors. A gate terminal of the first driver transistor 410 may be coupled to the second level shifter output 122, and a gate terminal of the second driver transistor 412 may be coupled to the first level shifter output 120.

In a particular embodiment, the driver 406 may be in the second power domain associated with the second supply voltage (vdd2). To illustrate, a first terminal 416 of the first driver transistor 410 may be coupled to the first driver port 424 that is coupled to the first level shifter output 120. A first terminal 420 of the second transistor 412 may be coupled to the second driver port 426 that is coupled to the second level shifter output 122. For example, the first terminal 416 of the first driver transistor 410 may be a drain terminal of the first driver transistor 410, and the first terminal 420 of the second driver transistor 412 may be a drain terminal of the second driver transistor 412. A second terminal 418 of the first driver transistor 410 and a second terminal 422 of the second transistor 412 may be coupled to the second voltage supply that provides the second supply voltage (vdd2). For example, the second terminal 418 of the first driver transistor 410 may be a source terminal of the first driver transistor 410, and the second terminal 422 of the second driver transistor 412 may be a source terminal of the second driver transistor 412.

During operation, the sense amplifier 102 and the level shifter 104 may operate in a manner described with respect to FIGS. 1 and 2. The driver 406 may generate the first driver output signal on the first driver port 424 and generate the second driver output signal on the second driver port 426. To illustrate, in response to the first level shifter output signal on the first level shifter output 120 being at approximately the ground voltage level, the second driver transistor 412 may be turned on. Because the second terminal 422 of the second transistor 412 is coupled to the second voltage supply providing the second supply voltage (vdd2), the second driver transistor 412 may generate the second driver output signal on the second driver port 426 such that the second driver output signal is at approximately the second voltage level (vdd2 level). In response to the first level shifter output signal on the first level shifter output 120 being at approximately the second voltage level (vdd2 level), the second driver transistor 412 may be turned off.

When the second driver transistor 412 is turned on, the second level shifted output signal (outb) may be based on both the second level shifter output signal on the second level shifter output 122 and the second driver output signal on the second driver port 426. When the second driver transistor 412 is turned off, the second level shifted output signal (outb) may be primarily based on the second level shifter output signal generated by the level shifter 104 on the second level shifter output 122.

In response to the second level shifter output signal on the second level shifter output 122 being at approximately the ground voltage level, the first driver transistor 410 may be on. Because the second terminal 418 of the first transistor 410 is coupled to the second voltage supply providing the second supply voltage (vdd2), the first driver transistor 410 may generate the first driver output signal on the first driver port 424 such that the first driver output signal is at approximately the second voltage level (vdd2 level). In response to the first level shifter output signal on the first level shifter output 120 being at approximately the second voltage level (vdd2 level), the first driver transistor 410 may be turned off.

When the first driver transistor 410 is turned on, the first level shifted output signal (out) may be based on both the first level shifter output signal on the first level shifter output 120 and the first driver output signal on the first driver port 424. When the first driver transistor 410 is turned off, the first level shifted output signal (out) may be primarily based on the first level shifter output signal generated by the level shifter 104 on the first level shifter output 120.

By generating the level shifted differential output signal (out, outb) at the second voltage level (vdd2 level) from the differential input signal (bit, bitb) at the first voltage level (vdd1 level), a short-circuit current that may result from use of the differential input signal (bit, bitb) without level-shifting is substantially eliminated. Substantially eliminating the short-circuit current may reduce power consumption by a device. Additionally, by using the driver 406, the level shifted differential output signal (out, outb) may be provided based on the level shifter differential output signal on the level shifter differential output 120, 122 and the driver output signals on the driver ports 424, 426 resulting in a stronger level shifted signal. Additionally, by using a small number of elements (e.g., the first transistor 250 and the second transistor 252) in the signal path between the sense amplifier 102 and the level shifted differential output signal (out, outb), a timing penalty on the signal path due to the level shifting operation is limited.

Although FIG. 4 shows the first driver transistor 410 and the second driver transistor 412 as p-channel MOS transistors, in another embodiment, the first driver transistor 410 and the second driver transistor 412 may be n-channel MOS transistors. For example, exchanging transistor types (i.e. replacing n-channel MOS transistors with p-channel MOS transistors and replacing p-channel MOS transistors with n-channel MOS transistors) and exchanging signal polarity (e.g. exchanging out and outb) may result in substantially similar operation as described with respect to the driver 406.

Figure 5:
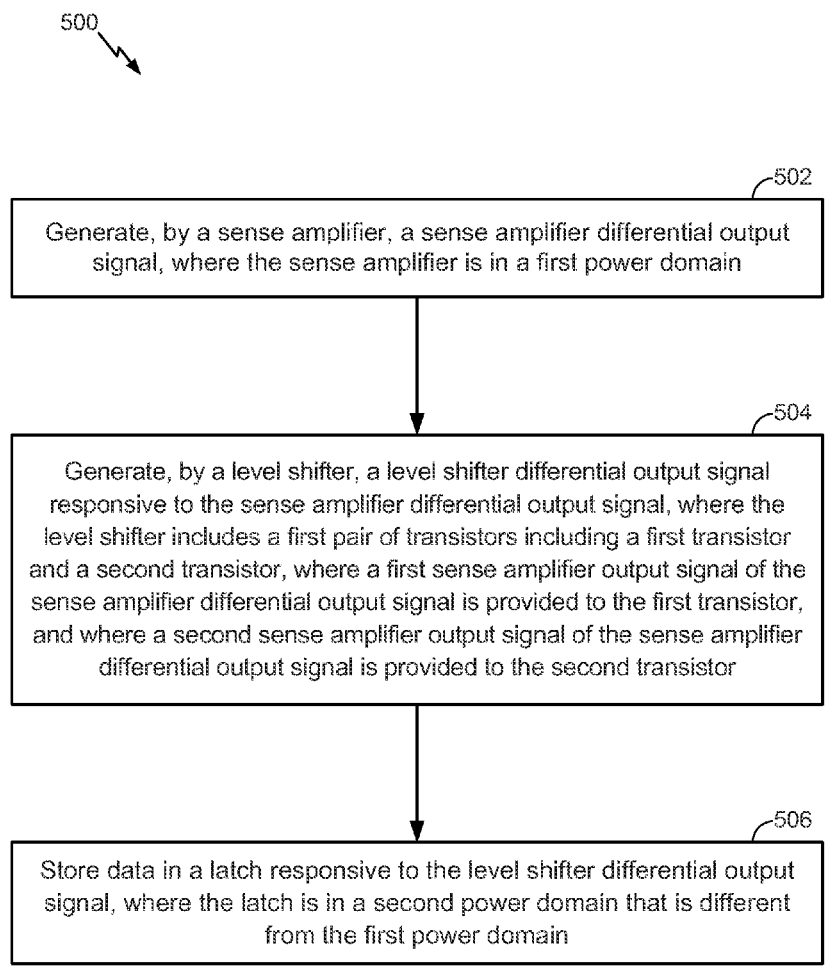
FIG. 5 is a flow chart of a particular illustrative embodiment of a method of operating either of the apparatus of FIG. 1 or the apparatus of FIG. 2.

Referring to FIG. 5, a particular illustrative embodiment of a method 500 of generating level shifted output signal according to the apparatus 100 of FIG. 1 and the apparatus 200 of FIG. 2 is depicted and generally designated 500. The method 500 includes generating, by a sense amplifier, a sense amplifier differential output signal, at 502. For example, the sense amplifier 102 of FIGS. 1, 2, and 4 may generate the sense amplifier differential output signal (sout, soutb). The sense amplifier may be in a first power domain. For example, the sense amplifier may be coupled to the first voltage supply that provides the first supply voltage (vdd1) as illustrated in FIGS. 1, 2, and 4.

A level shifter may generate a level shifter differential output signal responsive to the sense amplifier differential output signal, at 504. For example, the level shifter 104 of FIGS. 1, 2, and 4 may generate the level shifter differential output signal on the level shifter differential output 120, 122. The level shifter may include a first pair of transistors including a first transistor and a second transistor. For example, the first pair of transistors may include the first transistor 110 and the second transistor 112 of FIG. 1, the first transistor 250 and the second transistor 252 of FIGS. 2 and 4, or the third transistor 254 and the fourth transistor 256 of FIGS. 2 and 4. A first sense amplifier output signal of the sense amplifier differential output signal is provided to the first transistor, and a second sense amplifier output signal of the sense amplifier differential output signal is provided to the second transistor. For example, the first sense amplifier output signal (sout) may be provided to the first transistor 110 of FIG. 1, and the second sense amplifier output signal (soutb) may be provided to the second transistor 112 of FIG. 1. As another example, the first sense amplifier output signal (sout) may be provided to the first transistor 250 and to the third transistor 254 of FIGS. 2 and 4, and the second sense amplifier output signal (soutb) may be provided to the second transistor 252 and to the fourth transistor 256 of FIGS. 2 and 4. The level shifter differential output signal may be generated after a single transistor delay associated with the first pair of transistors after the first sense amplifier output signal is provided to the first transistor and the second sense amplifier output signal is provided to the second transistor.

The method 500 may further include storing data in a latch responsive to the level shifter differential output signal. For example, the latch 106 of FIGS. 1 and 2 may store data corresponding to the level shifter differential output signal on the level shifter differential output 120, 122. The latch 106 may be in a second power domain that is different from the first power domain. For example, the latch 106 may be coupled to the second voltage supply that provides the second supply voltage (vdd2) as illustrated in FIGS. 1 and 2.

The method 500 of FIG. 5 may be implemented by an application-specific integrated circuit (ASIC), a field-programmable gate array (FPGA) device, a processing unit such as a central processing unit (CPU), a digital signal processor (DSP), a controller, another hardware device, firmware device, or any combination thereof. As an example, the method of FIG. 5 can be performed by or in response to signals or commands from a processor that executes instructions, as described with respect to FIG. 6.

Figure 6:
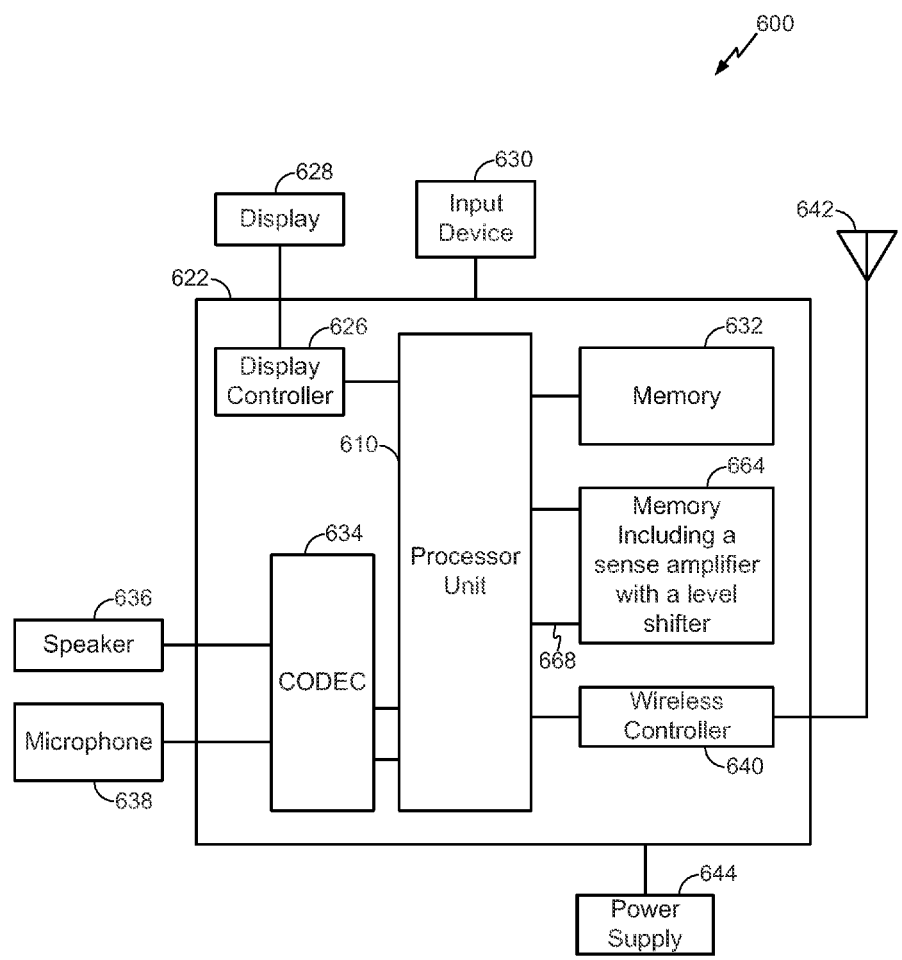
FIG. 6 is a block diagram of a wireless device including a memory including a sense amplifier with a level shifter.

Referring to FIG. 6, a block diagram of a particular illustrative embodiment of a wireless communication device is depicted and generally designated 600. The wireless communication device 600 includes a processor unit 610, such as a digital signal processor (DSP), coupled to a memory 632. The wireless communication device 600 may include a memory including a sense amplifier with a level shifter 664. In an illustrative embodiment, the sense amplifier with the level shifter included in the memory may correspond to the apparatus 100 of FIG. 1, the apparatus 200 of FIG. 2, the apparatus 400 of FIG. 4, or may operate according to the method 500 of FIG. 5, or any combination thereof. The memory including a sense amplifier with the level shifter 664 may be a non-transitory computer readable medium storing program code that is executable by the processor unit 610 (e.g., a computer).

The memory 632 may be a non-transitory computer readable medium storing program code that is executable by the processor unit 610 (e.g., a computer) to cause the processor unit 610 to retrieve data from the memory that includes the sense amplifier with the level shifter 664. The memory 632 may be a non-transitory computer readable medium storing program code that is executable by the processor unit 610 (e.g., a computer) to cause the processor unit 610 to store data in the memory that includes the sense amplifier with the level shifter 664.

FIG. 6 also shows a display controller 626 that is coupled to the processor unit 610 and to a display 628. A coder/decoder (CODEC) 634 can also be coupled to the processor unit 610. A speaker 636 and a microphone 638 can be coupled to the CODEC 634.

FIG. 6 indicates that a wireless controller 640 can be coupled to the processor unit 610 and to a wireless antenna 642. In a particular embodiment, the processor unit 610, the memory including a sense amplifier with a level shifter 664, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

While FIG. 6 illustrates a particular embodiment of a wireless device 600, one or more memories (e.g., the memory including a sense amplifier with a level shifter 664) may be integrated in other electronic devices including a set top box, a music player, a video player, an entertainment unit, a navigation device, a communications device, a personal digital assistant (PDA), a fixed location data unit, and a computer.

In conjunction with the described embodiments, an apparatus is disclosed that may include means for generating a differential output signal having a differential output, where the means for generating the differential output signal is in a first power domain. For example, the means for generating a differential output signal having a differential output may include the sense amplifier 102 of FIG. 1, the sense amplifier 102 of FIG. 2, the sense amplifier 102 of FIG. 4, one or more other devices or circuits having a differential output that are configured to generate a differential output signal, or any combination thereof. The apparatus may also include means for generating a level shifter differential output signal having a level shifter differential output and coupled to the differential output, where the means for generating the level shifter differential output signal includes a first pair of transistors including a first transistor and a second transistor, where a first output of the differential output is coupled to the first transistor, and where a second output of the differential output is coupled to the second transistor. For example, the means for generating a level shifter differential output signal having a level shifter differential output may include the level shifter 104 of FIG. 1, the level shifter 104 of FIG. 2, the level shifter 104 of FIG. 4, one or more other devices or circuits having a level shifter differential output that are configured to generate a level shifter differential output signal, or any combination thereof. The apparatus may further include means for storing data, the means for storing data coupled to the level shifter differential output, where the means for storing data is in a second power domain that is different from the first power domain. For example, the means for storing data may include the latch 106 of FIG. 1, the latch 106 of FIG. 2, the driver 406 of FIG. 4, one or more other devices or circuits configured to store data, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a sense amplifier having a sense amplifier differential output, wherein the sense amplifier is in a first power domain;
    a level shifter having a level shifter differential output and coupled to the sense amplifier differential output, wherein the level shifter includes a first transistor, a second transistor, a third transistor, and a fourth transistor, wherein a first sense amplifier output of the sense amplifier differential output is coupled to the first transistor and to the third transistor, and wherein a second sense amplifier output of the sense amplifier differential output is coupled to the second transistor and to the fourth transistor; and
    a latch to store data, the latch including a first pull-up transistor having a gate coupled to a gate of the second transistor, to a gate of the fourth transistor, and to the first sense amplifier output, wherein the latch is coupled to the level shifter differential output, wherein the latch is in a second power domain that is different from the first power domain, and wherein a first level shifter output of the level shifter differential output and a first latch output of the latch are coupled to a first common node.

2. The apparatus of claim 1, wherein the first sense amplifier output of the sense amplifier differential output is coupled to a gate terminal of the first transistor and to a gate terminal of the third transistor, and wherein the second sense amplifier output of the sense amplifier differential output is coupled to a gate terminal of the second transistor and to a gate terminal of the fourth transistor.

3. The apparatus of claim 2, wherein a first terminal of the first transistor and a first terminal of the second transistor are coupled to a ground supply, and wherein a second terminal of the first transistor and a second terminal of the second transistor are coupled to the latch.

4. The apparatus of claim 3, wherein the second terminal of the first transistor is coupled to the first level shifter output of the level shifter differential output and wherein the second terminal of the second transistor is coupled to a second level shifter output of the level shifter differential output.

5. The apparatus of claim 4, wherein the second terminal of the third transistor is coupled to the second level shifter output of the level shifter differential output and wherein the second terminal of the fourth transistor is coupled to the first level shifter output of the level shifter differential output.

6. The apparatus of claim 1, wherein the sense amplifier is selectively enabled in response to an enable signal, wherein the sense amplifier is configured to generate a sense amplifier differential output signal on the sense amplifier differential output, and wherein one of a first sense amplifier output signal of the sense amplifier differential output signal and a second sense amplifier output signal of the sense amplifier differential output signal is asserted by the sense amplifier during a time interval.

7. The apparatus of claim 1, wherein the latch further includes:
    a first pair of transistors having an inverter configuration, the first pull-up transistor coupled to a terminal of a transistor of the first pair of transistors;
    a second pair of transistors having the inverter configuration; and
    a second pull-up transistor including a gate terminal coupled to the second sense amplifier output, the second pull-up transistor coupled to a terminal of a transistor of the second pair of transistors.

8. A method comprising:
    generating, by a sense amplifier, a sense amplifier differential output signal, wherein the sense amplifier is in a first power domain;
    generating, by a level shifter at a level shifter differential output including a first level shifter output coupled to a first common node, a level shifter differential output signal responsive to the sense amplifier differential output signal, wherein the level shifter includes a first transistor, a second transistor, a third transistor, and a fourth transistor, wherein a first sense amplifier output signal of the sense amplifier differential output signal is provided to the first transistor and to the third transistor, and wherein a second sense amplifier output signal of the sense amplifier differential output signal is provided to the second transistor and to the fourth transistor;
    storing data in a latch responsive to the level shifter differential output signal, wherein the latch is in a second power domain that is different from the first power domain, wherein the latch includes a first pull-up transistor having a gate coupled to a gate of the second transistor, to a gate of the fourth transistor, and to a first output of the sense amplifier; and driving, using the first pull-up transistor, the level shifter differential output signal based on the data via a first latch output of the latch coupled to the first common node.

9. The method of claim 8, wherein the level shifter differential output signal is generated after a single transistor delay associated with the first transistor and the second transistor after the first sense amplifier output signal is provided to the first transistor and the second sense amplifier output signal is provided to the second transistor.

10. The method of claim 8, wherein the first output of the sense amplifier is coupled to a gate terminal of the first transistor and to a gate terminal of the third transistor to pull down a voltage at the first level shifter output and to pull up a voltage at a second level shifter output in response to the first sense amplifier output signal having a logical high value corresponding to the first power domain, and wherein a second output of the sense amplifier is coupled to a gate terminal of the second transistor and to a gate terminal of the fourth transistor to pull up a voltage at the first level shifter output and to pull down a voltage at the second level shifter output in response to the second sense amplifier output signal having the logical high value corresponding to the first power domain.

11. The method of claim 10, wherein a first terminal of the first transistor and a first terminal of the second transistor are coupled to a ground supply, and wherein a second terminal of the first transistor and a second terminal of the second transistor are coupled to the latch, wherein the latch further includes a first pair of transistors having an inverter configuration and a second pair of transistors having the inverter configuration, wherein the first pull-up transistor is coupled to a terminal of a transistor of the first pair of transistors to enable the first pair of transistors to drive the first level shifter output to a logical high value corresponding to the second power domain in response to the second level shifter output having a logical low value, and wherein the latch further includes a second pull-up transistor coupled to the second output of the sense amplifier and to a terminal of a transistor of the second pair of transistors to enable the second pair of transistors to drive the second level shifter output to the logical high value corresponding to the second power domain in response to the first level shifter output having the logical low value.

12. An apparatus comprising:
means for generating a differential output signal having a differential output, wherein the means for generating the differential output signal is in a first power domain;
means for generating a level shifter differential output signal having a level shifter differential output and coupled to the differential output, wherein the means for generating the level shifter differential output signal includes a first transistor, a second transistor, a third transistor, and a fourth transistor, wherein a first output of the differential output is coupled to the first transistor and to the third transistor, and wherein a second output of the differential output is coupled to the second transistor and to the fourth transistor; and
means for storing data, the means for storing data coupled to the level shifter differential output, the means for storing data including a first pull-up transistor having a gate coupled to the first output of the differential output, to a gate of the second transistor, and to a gate of the fourth transistor,
wherein the means for storing data is in a second power domain that is different from the first power domain, and wherein a first level shifter output of the level shifter differential output and a first output of the means for storing data are coupled to a first common node.

13. The apparatus of claim 12, wherein the first output of the differential output is coupled to a gate terminal of the first transistor and to a gate terminal of the third transistor and wherein the second output of the differential output is coupled to a gate terminal of the second transistor and to a gate terminal of the fourth transistor.

14. The apparatus of claim 12, wherein the means for storing data further includes a first pair of transistors having an inverter configuration and a second pair of transistors having the inverter configuration, wherein the first pull-up transistor is coupled to a terminal of a transistor of the first pair of transistors, and wherein a second pull-up transistor is coupled to a terminal of a transistor of the second pair of transistors.

15. A non-transitory computer-readable medium comprising instructions that, when executed by a processor, cause the processor to perform operations, wherein the operations comprise:
retrieving data from a memory, wherein retrieving the data comprises:
generating, via a sense amplifier, a sense amplifier differential output signal, wherein the sense amplifier is in a first power domain;
generating, via a level shifter at a level shifter differential output including a first level shifter output coupled to a first common node, a level shifter differential output signal responsive to the sense amplifier differential output signal, wherein the level shifter includes a first transistor, a second transistor, a third transistor, and a fourth transistor, wherein a first sense amplifier output signal of the sense amplifier differential output signal is provided to the first transistor and to the third transistor, and wherein a second sense amplifier output signal of the differential output signal is provided to the second transistor and to the fourth transistor;
storing the data in a latch responsive to the level shifter differential output signal, the latch including a pull-up transistor having a gate coupled to a gate of the second transistor, to a gate of the fourth transistor, and to a first output of the sense amplifier, wherein the latch is in a second power domain that is different from the first power domain; and
driving, using the pull-up transistor, the level shifter differential output signal based on the data via a first latch output of the latch coupled to the first common node.

16. The apparatus of claim 1, wherein a second level shifter output of the level shifter differential output and a second latch output of the latch are coupled to a second common node.

17. The apparatus of claim 16, wherein the latch stores a first data value at the first common node, and wherein the latch stores a second data value at the second common node.

18. The apparatus of claim 16, wherein a first output signal at the first common node is based on a first level shifter output signal that is output at the first level shifter output and based on a first latch output signal that is output at the first latch output, and wherein a second output signal at the second common node is based on a second level shifter output signal that is output at the second level shifter output and based on a second latch output signal that is output at the second latch output.

19. The apparatus of claim 1, wherein a first level shifted output signal corresponds to a high voltage state when the first sense amplifier output corresponds to a first voltage state, and wherein the latch is configured to continue to drive the first level shifted output signal at the high voltage state based on the data when the first sense amplifier output transitions from the first voltage state to a second voltage state.

20. The apparatus of claim 7, wherein a gate of the second pull-up transistor is coupled to a gate of the first transistor and to a gate of the third transistor.

* * * * *